United States Patent

Schendel, Jr.

[15] 3,676,712

[45] July 11, 1972

[54] MONOLITHIC NON-SATURATING STORAGE CIRCUIT

[72] Inventor: Donald D. Schendel, Jr., Scottsdale, Ariz.

[73] Assignee: Motorola, Inc., Franklin Park, Ill.

[22] Filed: March 22, 1971

[21] Appl. No.: 126,598

[52] U.S. Cl. ............................307/291, 307/299 A, 307/280

[51] Int. Cl. ........................................................H03k 3/286

[58] Field of Search........................307/292, 291, 299 A, 280

[56] References Cited

UNITED STATES PATENTS

| | | | |
|---|---|---|---|
| 2,990,478 | 6/1961 | Scarbrough | 307/292 X |
| 3,020,417 | 2/1962 | Cheilik | 307/292 X |
| 3,384,766 | 5/1968 | Kardash | 307/292 |
| 3,560,766 | 2/1971 | Moore | 307/292 X |

*Primary Examiner*—John S. Heyman
*Attorney*—Mueller & Aichele

[57] ABSTRACT

Flip-flop circuits have many uses in electronics and particularly in logic circuits. Since, in logic circuits, speed of operation is highly desirable, a flip-flop circuit which can change its state in a very short period of time is desirable. A flip-flop circuit is disclosed including means to prevent either of the transistors comprising the flip-flop circuit from becoming saturated during operation thereof, whereby the speed of operation of the flip-flop circuit is increased.

10 Claims, 4 Drawing Figures

Figure 1:
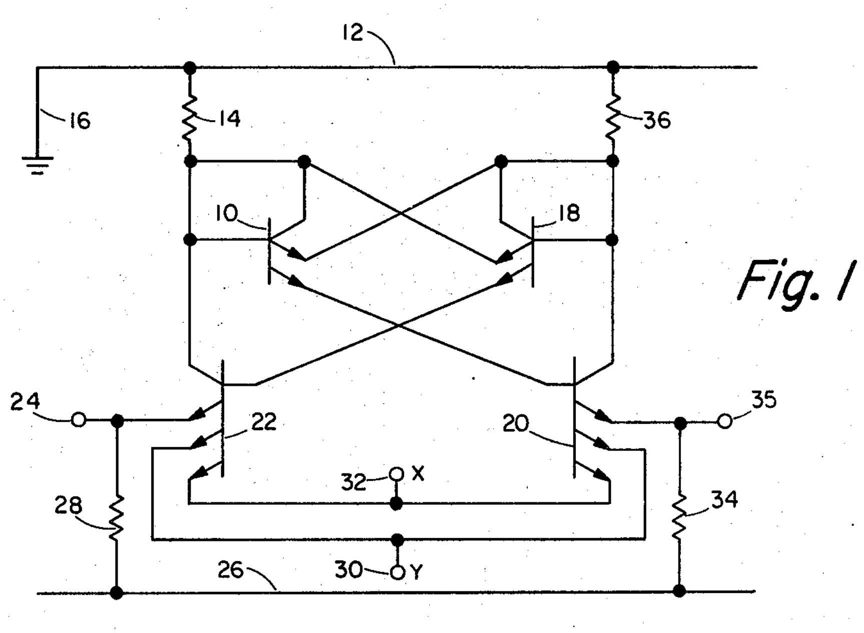

INVENTOR
Donald D. Schendel Jr.
BY
Mueller & Aichele
ATTY'S.

MONOLITHIC NON-SATURATING STORAGE CIRCUIT

BACKGROUND

This invention relates to flip-flop circuits in general and to memory or storage devices for logic circuits that may take the form of flip-flop circuits.

In operation of much of the electronic circuits, speed of operation is important. Since for example, in a logic circuit, where a great many operations take place in arriving at an answer to a problem, many of the operations involving memory and storage devices, which advantageously take the form of flip-flops, the time taken to change the condition of the flip-flop is a factor which may increase the time it takes the logic circuit to arrive at an answer. Obviously, while the logic circuit is solving one problem, it cannot work on other problems, whereby it is advantageous to provide quickly operating logic circuits.

A flip-flop, which usually comprises two transistors whose collectors and bases are cross connected, is useful in a logic circuit, since at one state, that is when one of the transistors is conducting and the other is not, the flip-flop may store or remember or indicate a logical one for example and when the flip-flop is in its other condition whereby the one transistor is non-conducting and the other transistor is conducting, the flip-flop may indicate a logical zero. In known flip-flops, the transistor that is conducting is saturated, that is, its collector (using NPN transistors) is negative with respect to the base. It is known that it takes longer to make a transistor that is saturated, non-conductive than it takes to make a transistor that is conductive but not saturated, non-conductive, and therefore a flip-flop which comprises transistors that are never saturated will operate, that is change state, faster than a transistor that is saturated.

It is an object of this invention to provide a logic circuit including a flip-flop that will operate faster than known such logic circuits.

It is a further object of this invention to provide a flip-flop including transistors which do not become saturated.

SUMMARY

In accordance with this invention, a pair of transistors are provided, a main electrode of each being cross connected to the base of the other. Means are provided to limit the voltage between the main electrode and the base of the transistor that is conducting to a value that prevents saturation of the conductive transistor and to regulate the current supplied to the conductive transistor. Furthermore, means are provided to apply the voltage between the main electrodes of the conductive transistor between the base and main electrode of the non-conducting transistor reduced in amount however so that the voltage between the base and the main electrode of the non-conducting transistor is in a direction to make the non-conducting transistor conductive but is at a value that is too low to render it conductive. Means are provided to cause read out of the conditions stored in the flip-flop and to change the condition of the flip-flop. The read out means may require two signal lines or inputs whereby the flip-flop can be arranged in rows and in columns and yet a particular flip-flop may be chosen.

DESCRIPTION

Figure 2:
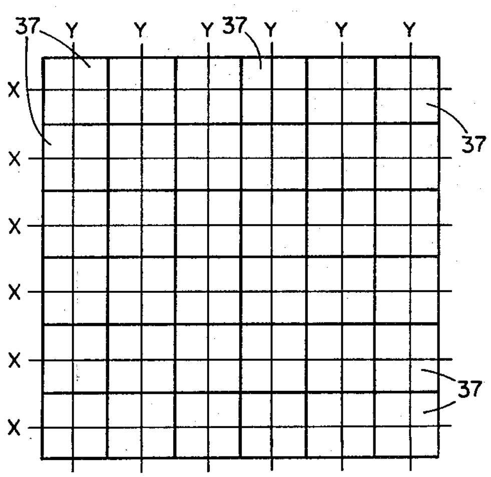
Figure 3:
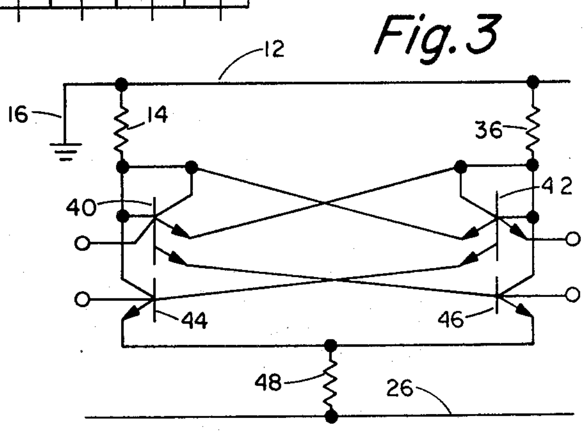
Figure 4:
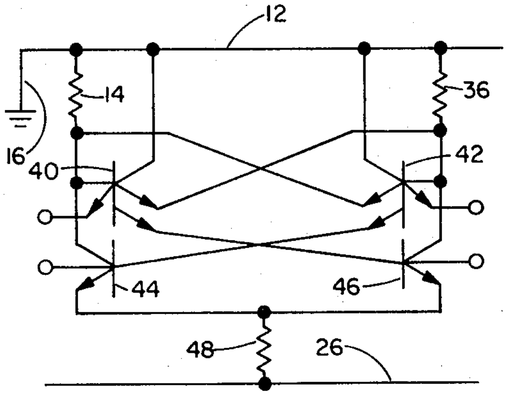

The invention will be better understood upon reading the following description, when read in connection with the accompanying drawing, in which, FIGS. 1, 3 and 4 are schematic diagrams of circuits including the present invention and FIG. 2 is a diagram showing how the circuit of FIG. 1 can be arranged in columns and in rows and still permit the addressing of a particular one of said circuits of FIG. 1.

Turning first to FIG. 1, the collector and base of a multi-emitter NPN transistor 10 are directly connected together and to a bus line 12 by way of a resistor 14. As shown, the bus line 12 may be grounded at 16. Since all the transistors to be mentioned are of the NPN type, no further mention of the type thereof need be made. The collector of the transistor 10 is also connected to the first emitter of a multi-emitter transistor 18. The first emitter of the transistor 10 is connected to the collector and base of a transistor 18. The second emitter of the transistor 10 is connected to the base of a multi-emitter transistor 20. The base of the transistor 10 is also connected to the collector of a multi-emitter transistor 22. The base of the transistor 22 is connected to the second emitter of the transistor 18 and the first emitter of the transistor 22 is connected to a terminal 24 and to a negative bus 26 by way of a resistor 28. A second emitter of the transistor 22 is connected directly to a Y terminal 30 and to the second emitter of the transistor 20. The third emitter of the transistor 22 is connected directly to an X terminal 32 and to the third emitter of the transistor 20. The first emitter of the transistor 20 is connected to the bus 26 by way of resistor 34. The collector of the transistor 20 is connected to the base and the collector of the transistor 18 and by way of resistor 36 to the positive bus 12.

In the circuit of FIG. 1, one of the transistors 20 or 22 will be conductive, and the other will not be conductive at that moment, the conductive transistor preventing the other transistor from being conductive and, neither transistor 20 or 22 will be saturated when it is conductive. Let it be assumed that the transistor 22 is conductive. For the transistor 22 to be conductive but not saturated, the base current for the transistor 22 is regulated. As noted, the base current for the transistor 22 is provided from the second emitter of the transistor 18, which does the current regulating. Since the transistor 22 is conductive, a substantial current flows in the resistor 14 and since the transistor 20 is non-conductive a smaller current flows in the resistor 36, whereby the collector and base of the transistor 10 is lower (that is more negative) than the collector and base of the transistor 18, and the base of the transistor 22 is lower by the base to emitter drop of the transistor 18 than the collector of the transistor 18. Therefore, the base and the collector of the transistor 22 are at equal potential, within processing errors, since the first emitter of the transistor 18 is connected to the collector of the transistor 22 and the two emitters of the transistor 18 are at the same potential. At this point, it should be noted that the transistor 18 has two emitters since if both the collector and base of the transistor 22 were held at the same potential by a metallic circuit, the current distribution to the base and to the collector of the transistor 22 by the metal connection to the same emitter of the transistor 18 to keep their potentials equal would not take place. Since the potential on the base and collector of the transistor 22 are kept nearly equal when the transistor 22 is conductive and also since the transistor 18 limits or regulates the base current for the transistor 22, the transistor 22 cannot become saturated, that is, its collector cannot become negative with respect to its base.

It has been shown that the base and collector of the transistor 22 are equal in potential. The potential from the base to the emitter (any emitter) of the transistor 22 is equal to one base emitter voltage drop, therefore, the potential between the collector and the emitter of the transistor 22 is one base to emitter voltage drop. It follows that the voltage between the base of the transistor 10 and the emitter of the transistor 20 is one base to emitter voltage drop, therefore the base to emitter voltage drop applied to each of the transistors 10 and 20 is a half of one base to emitter voltage drop and neither transistor 10 or 20 can conduct. Therefore, when the transistor 22 is conductive, it is not saturated and the transistor 20 is not conducting. In a similar manner, since the circuit is symmetrical, when the transistor 20 is conductive it is not saturated and the transistor 22 is not conductive.

Means are provided to read out the condition of the flip-flop of FIG. 1 and to change its condition at will. For example, let it be assumed that a number of flip-flops 37 of FIG. 1 are arranged in an array of rows and columns as shown in FIG. 2 by the several rectangles labelled 37 thereof and that it is desired to read out the condition of one flip-flop of the array. The lines X in FIG. 2 are connected to all the X terminals of all the flip-flops in its respective row but not in other rows, and the lines Y are all connected to the Y terminals of all the flip-flops in a respective column but not in other columns. As is known, current must flow out of the emitter of the transistor 20 or 22 that is conducting, whereby current normally flows in the line X or Y or both of them to the bus 26. If the voltage on the line X and on the line Y are raised, that is made more positive, by any suitable means not shown, so that no current can flow in the emitters of the conductive transistor to which the X and the Y lines are connected, then current will flow in the first emitter of the conductive transistor 20 or 22 through the resistance 34 or 28 and the voltage at the corresponding terminal 24 or 35 will differ from the voltage of the bus 26 by the IR drop in the resistor 34 or 28, indicating which transistor 20 or 22 is conducting. Therefore, by choice of the X and Y lines to be raised in potential, the output of any flip-flop of the array of flip-flops of FIG. 2 can be read out.

If it is desired to change the condition of the flip-flop of FIG. 1, the voltages on the X and Y lines are increased so no current flows in the second and third emitters of the transistor 20 and 22 of that flip-flop whose condition is to be changed and then the potential on the remaining or first emitter of the conductive transistor is made so high (positive) that the respective transistor 20 or 22 cannot conduct and therefore the other transistor of the flip-flop transistors becomes conductive. This operation is a follows. Let it be assumed that the transistor 22 is conductive and it is desired to make the transistor 20 conductive and the transistor 22 non-conductive. As noted above, the transistor 20 is made non-conductive whereby the voltage across the resistor 14 goes down and the voltage at the collectors of the transistors 10 and 22 goes up whereby the voltage across the base to emitter of the two transistors 10 and 20 goes up until they are conductive. Current increases in the resistor 36 (since some current always flows in the resistors 14 and 36) whereby the voltage on the collector of the transistor 20 goes down with increasing current flow in the transistor 20 and decreasing the voltage across the base to emitter of the transistors 18 and 22 whereby which decreases the tendency of the transistor 22 to conduct and increases the tendency of the transistors 10 and 20 and therefore 20 to conduct. This action is regenerative and very quick since as noted above, the transistors 20 and 22 are never saturated. So, the state of the flip-flop of FIG. 1, which can be used as an element of a readable memory array of FIG. 2, can be changed very quickly.

The circuit of FIG. 3 closely resembles the circuit of FIG. 1 whereby similar elements in these two Figures have been given the same reference character. In FIG. 3, a transistor 40 and 42 which each has three emitters is substituted for the transistors 10 and 18 respectively of FIG. 1 and the third emitter of the transistors 40 and 42 are terminals of the circuit of FIG. 3, the other electrodes of the transistors 40 and 42 being connected similarly to corresponding electrodes of the transistors 10 and 18. Furthermore, single emitter transistors 44 and 46 are substituted for transistors 22 and 20 of FIG. 1 respectively and the emitters of the transistors 44 and 46 are connected together and through a resistor 48 to the bus 26. It will be noted that while the transistors 44 and 46 each have only one emitter that they each have additional base connections which are terminals of the circuit of FIG. 3.

As far as the non-saturating flip-flop action is concerned, no explanation need be given of the circuit of FIG. 3, since the circuit of FIG. 3 and 1 operate similarly. The read out of FIG. 3 may be taken from the third emitters of the transistors 40 and 42. The state of the transistors 44 and 46 may be flipped by applying a negative voltage with respect to the bus 12 thereof to the extra base connection of that transistor 44, 46 that is non-conducting to cause it to conduct. The flipping action is similar to that explained in connection with FIG. 1 when the transistors 20 or 22 which is conductive is made non-conductive by applying positive potential to all three emitters thereof. The circuit of FIG. 3 may be used as a storage means. The output is taken from the extra emitters for the transistors 40 and 42 as noted, however since the bases and collectors thereof, being connected together, cannot differ in voltage, the current supply for the extra emitters of the transistors 40 and 42 is small and the driving current that these extra emitters can supply is very small.

If it is desired to drive a load requiring a greater driving current than that which is provided by the circuit of FIG. 3, the circuit of FIG. 4 is used. Since the circuit of FIG. 4 differs from the circuit of FIG. 3 only in that the collectors of the transistors 40 and 42 are connected directly to the positive bus 12 instead of to their respective bases, no further description will be given for the circuit of FIG. 4 except to note that the similar elements in FIGS. 3 and 4 have been given similar reference characters. In FIG. 4, which operates like FIG. 3, since the voltages of the collectors of the transistors 40 and 42 can differ by the voltage drops in the respective resistors 14 and 36 from their respective emitters, the output current at the third emitters of the transistors 40 and 42 can be much greater than the emitter current for the third emitters of the transistors 40 and 42 of FIG. 3. Also, due to the drop across the resistors 14 and 36, and it being remembered that a small amount of current flows through both resistors 14 and 36 at all times, the collectors of the transistors 40, 42 cannot become more negative than their respective bases, that is, the transistors 40 and 42, as well as the transistors 44 and 46, cannot become saturated.

It will be noted that a very versatile flip-flop which includes transistors which cannot become saturated is disclosed. The flip-flop can be put on a chip with other such flip-flops and with other integrated circuitry if desired or they can be made of discrete elements. While NPN transistors are shown, a person skilled in the art can change the circuit to use PNP transistors.

What is claimed is:

1. A non-saturating flip-flop comprising
a first and a second supply terminal,
a first and a second resistor,
a first and a second transistor having a base, a collector, and two emitters,
a third and a fourth transistor having a base, a collector, and an emitter,
a connection from said first supply terminal through said first resistor to the base of said first transistor and to the collector of said third transistor,
means for connecting the emitter of said third transistor to said second supply terminal,
a connection from said first supply terminal through said second resistor to the base of said second transistor and to the collector of said fourth transistor,
means for connecting the emitter of said fourth transistor to said second supply terminal,
means for connecting the collector of said first and second transistors to the first emitter of the other of said first and second transistors, and
means for connecting the other emitter of the first and second transistors to the base of said fourth and third transistors respectively.

2. The invention of claim 1 in which the bases of each of said first and second transistors are directly connected to their own collectors.

3. The invention of claim 1 in which the collectors of said first and second transistors are directly connected to said first terminal.

4. The invention of claim 1 in which said means for connecting said emitters of said third and fourth transistors includes respective resistors connected between the emitters and said second supply terminal.

5. The invention of claim 1 in which said means for connecting said emitters of said third and fourth transistors to said second terminal includes a common resistor.

6. The invention of claim 1 in which said third and fourth transistors each includes a second and third emitter and in which said second and third emitters of the third transistor are respectively connected to the second and third emitters of said fourth transistor.

7. The invention of claim 6 in which separate terminal means are provided to bias said second and third emitters to emitter non-conduction.

8. The invention of claim 6 in which said first and second transistors each include a third emitter which acts as an output terminal.

9. The invention of claim 6 in which said third and fourth transistors each includes a second base connection to which current inducing input may be applied.

10. A non-saturating flip-flop comprising:

a first and a second supply terminal;

a first and a second transistor each having a first and a second main electrode and a control electrode, the first main electrodes being connected to the first supply terminal;

a first resistor connected at one end to the second supply terminal and at the other end to a first junction with the second main electrode of the first transistor;

a second resistor connected at one end to the second supply terminal and at the other end to a second junction with the second main electrode of the second transistor;

first current regulating means comprising a third transistor having a first, second and third main electrode and a control electrode, the control electrode and the third main electrode being connected together at the first junction, the first main electrode being connected to the second junction and the second main electrode being connected to the control electrode of the second transistor; and second current regulating means comprising a fourth transistor having a first, second and third main electrode and a control electrode, the control electrode being connected to the third main electrode at the second junction, the first main electrode being connected to the first junction and the second main electrode being connected to the control electrode of the first transistor.

* * * * *